United States Patent
Poon et al.

(10) Patent No.: US 8,324,011 B2
(45) Date of Patent: Dec. 4, 2012

(54) IMPLEMENTATION OF TEMPERATURE-DEPENDENT PHASE SWITCH LAYER FOR IMPROVED TEMPERATURE UNIFORMITY DURING ANNEALING

(75) Inventors: Chyiu Hyia Poon, Singapore (SG); Alex See, Singapore (SG); Mei Sheng Zhou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 765 days.

(21) Appl. No.: 11/853,156

(22) Filed: Sep. 11, 2007

(65) Prior Publication Data

US 2009/0068825 A1  Mar. 12, 2009

(51) Int. Cl.
  *H01L 21/00* (2006.01)
(52) U.S. Cl. ............ 438/72; 438/69; 438/550; 438/799; 257/E21.324
(58) Field of Classification Search .................... 438/69, 438/72, 96, 97, 550, 799; 257/E21.324, E21.325
See application file for complete search history.

(56) References Cited

U.S. PATENT DOCUMENTS

| | | | |
|---|---|---|---|
| 6,200,887 B1 * | 3/2001 | Balasubramaniam et al. | 438/585 |
| 6,303,476 B1 * | 10/2001 | Hawryluk et al. | 438/530 |
| 6,335,253 B1 | 1/2002 | Chong et al. | |
| 6,387,784 B1 | 5/2002 | Chong et al. | |
| 6,897,118 B1 | 5/2005 | Poon et al. | |
| 7,071,069 B2 | 7/2006 | Tan et al. | |
| 7,190,040 B2 * | 3/2007 | Liu | 257/499 |
| 7,560,383 B2 * | 7/2009 | Joo et al. | 438/680 |
| 7,642,205 B2 * | 1/2010 | Timans | 438/795 |

OTHER PUBLICATIONS

Akira Matsuno et al., "Function of Phase Switch Layer for Ultra Shallow Junction Formation by Green Laser Annealing", Extended Abstracts of the 2005 International Conf. on Solid State Devices and Materials, Kobe, 2005, pp. 914-915.

* cited by examiner

*Primary Examiner* — Matthew Landau
*Assistant Examiner* — Colleen E Snow
(74) *Attorney, Agent, or Firm* — Horizon IP Pte Ltd

(57) ABSTRACT

The present invention provides a method of annealing a semiconductor by applying a temperature-dependant phase switch layer to a semiconductor structure. The temperature-dependant phase switch layer changes phase from amorphous to crystalline at a predetermined temperature. When the semiconductor structure is annealed, electromagnetic radiation passes through the temperature-dependant phase switch layer before reaching the semiconductor structure. When a desired annealing temperature is reached the temperature-dependant phase switch layer substantially blocks the electromagnetic radiation from reaching the semiconductor structure. As a result, the semiconductor is annealed at a consistent temperature across the wafer. The temperature at which the temperature-dependant phase switch layer changes phase can be controlled by an ion implantation process.

21 Claims, 5 Drawing Sheets

IMPLEMENTATION OF TEMPERATURE-DEPENDENT PHASE SWITCH LAYER FOR IMPROVED TEMPERATURE UNIFORMITY DURING ANNEALING

BACKGROUND OF THE INVENTION

The present invention relates to a method of fabricating semiconductor structures and, more particularly, to a method of reducing temperature non-uniformities across semiconductor structures during annealing.

Minimum feature sizes of CMOS semiconductor devices are continuously being reduced. One of the detrimental effects of smaller geometries is short channel and punch-through effects. To overcome these effects, ultra-shallow, abrupt and highly activated junctions are used. However, below the 45 nm node, transient enhanced diffusion (TED) and solid solubility limitations may necessitate stringent junction requirements on annealing processes. That is, annealing may cause diffusion of dopants from the dopant profile created during ion implantation. Conventional rapid thermal annealing (RTA) coupled with low energy implantation have not been successful in fulfilling these requirements. Because of this, alternative annealing processes have been actively investigated. These include non-filament based flash annealing, such as Xenon lamp, and laser annealing techniques.

Flash annealing and laser annealing imparts a significantly smaller thermal budget to the wafer as compared to RTA, because of the smaller pulse duration (in the ms range or less) and because only the near surface region of the wafer surface is heated. As a result, the problem of diffusion from the as-implanted profile during annealing is minimized. However, flash and laser annealing can result in temperature non-uniformities across the wafer surface due to pattern density dependency. That is, the degree to which the wafer is heated varies across the wafer because the reflectance (and consequently heat absorption) of the annealing light varies with pattern density. Pattern density effects result because different materials on the wafer surface reflect and absorb light to different degree. This results in a variance in the annealing temperature across the wafer. By changing the distances between the different structures/materials on the wafer, the temperature profile also changes. The temperature uniformity is thus also affected. These temperature non-uniformities can cause different dopant activations during annealing at different locations on the wafer resulting in an undesirable variance in the performance of identical transistors on different parts of the wafer.

As can be seen, there is a need for a method of reducing the temperature non-uniformity of a semiconductor wafer during flash and laser annealing.

SUMMARY OF THE INVENTION

In one aspect of the present invention, a method of annealing a semiconductor comprises applying a temperature-dependant phase switch layer to a semiconductor structure, the temperature-dependant phase switch layer changing phase at a predetermined temperature; annealing the semiconductor structure by passing electromagnetic radiation through the temperature-dependant phase switch layer to raise the temperature of the semiconductor structure; and blocking the electromagnetic radiation from reaching the semiconductor structure when the temperature-dependant phase switch layer reaches the predetermined temperature.

In another aspect of the present invention, a method of fabricating a semiconductor comprises fabricating a semiconductor wafer having regions of varying pattern density; applying a layer having changeable reflectivity to the surface of the semiconductor wafer, including the regions of varying pattern density; heating the semiconductor wafer by passing heat through the layer; and changing the reflectivity of the layer when a predetermined temperature is reached, such that the heat is blocked from the semiconductor wafer when the regions of varying pattern density are at substantially the same temperature.

In accordance with a further aspect of the present invention, a method of uniformly activating doping regions of a semiconductor wafer comprises doping selected regions of the semiconductor wafer; depositing a phase switch layer on the semiconductor wafer, the phase switch layer changing from a substantially amorphous material to a substantially crystalline material at a phase switch temperature; implanting ions in the phase switch layer to modify the phase switch temperature of the phase switch layer to a predetermined temperature; activating the doped regions by passing electromagnetic radiation through the phase switch layer and into the doped regions, the electromagnetic radiation raising the temperature of the doped regions and of the phase switch layer, wherein the activation substantially stops at a uniform temperature across the wafer when the phase switch layer reaches the predetermined temperature; and removing the phase switch layer.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be advantageously used in semiconductor fabrication processes using flash and laser annealing where it is desirable to have a high degree of uniformity of performance of devices on a wafer.

Embodiments of the present invention may provide a phase shift layer that has a predetermined phase shift temperature at the desired annealing temperature. During annealing, the phase shift layer changes from a substantially amorphous state to a substantially crystalline state at a uniform temperature across the wafer. Once the phase shift layer becomes crystalline, it reflects more of the annealing light, substantially stopping the annealing process taking place on the transistor structures below the phase shift layer. The annealing process itself is carried out to just above the desired annealing temperature. Presence of the phase shift layer limits the annealing to a single maximum temperature across the wafer since the phase change occurs at a single temperature. The phase shift temperature is determined by an ion implant process that controls the degree of amorphization of the phase shift layer. Hence, no portion of the wafer is allowed to exceed this temperature. Note that even though there may be variations in the time it takes different areas to reach the phase shift temperature, because of different pattern densities and distances from the light source, all areas of the wafer will still undergo annealing at the phase shift temperature.

Prior art semiconductor fabrication methods for flash and laser annealing did not employ a phase shift layer having a phase shift temperature predetermined by the degree of amorphization, created via ion implantation to change phase at the same temperature across the wafer. Instead some prior art fabrication methods relied on variations in thickness to provide some degree of control over temperature non-uniformities.

Figure 1:
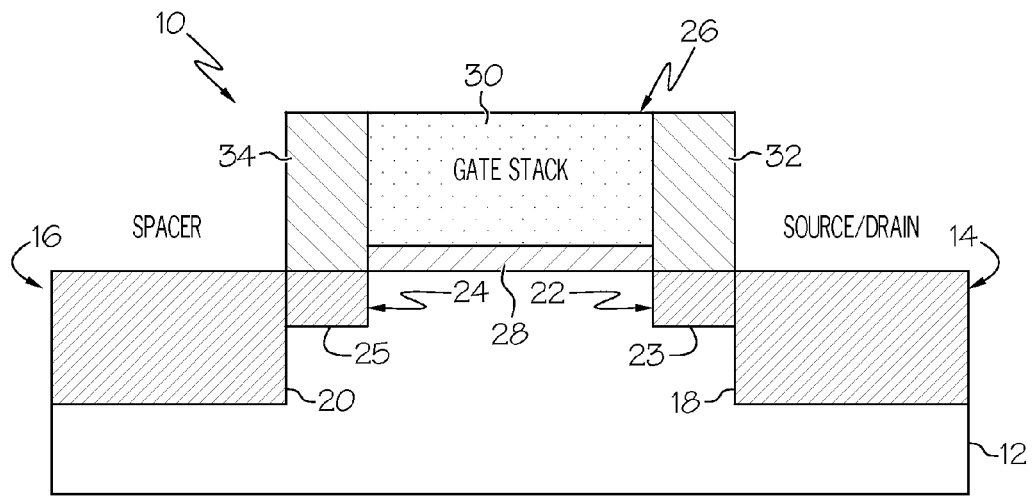
FIG. 1 shows a cross-sectional representation of a CMOS transistor prior to annealing in accordance with one embodiment of the present invention.

FIG. 1 shows a cross-sectional view of a CMOS transistor structure 10 after conventional processing up to the point of annealing. It will be appreciated that transistor structure 10 may be part of a semiconductor wafer (not shown) containing a large number of identical transistor structures, as well as other semiconductor structures. In particular, at this stage, an ion implantation process may have been performed on the transistor structure 10 resulting in a transistor substrate 12 having doped regions 14, 16, 22 and 24. The doped regions 14, 16, 22 and 24 may have a predetermined dopant profile with defined edges, shown at 18, 20, 23 and 25. The transistor substrate 12 may be monocrystalline silicon and the ions implanted may be Si, Ge or Ar or other dopants which break the lattice bonds and create a non-crystalline or amorphous silicon layer in the semiconductor substrate 12. A gate stack 26 may also have been formed using conventional methods over the semiconductor substrate 12. In particular, a gate oxide layer 28, which may comprise silicon dioxide that may be formed by thermal oxidation or by chemical vapor deposition (CVD), may be formed overlying the semiconductor substrate 10. A etch stop layer 30, which may be comprised of polysilicon or other suitable materials, may be formed over the gate oxide layer 28, which will form the gate of the transistor 10. The etch stop layer 30 may be deposited using, for example, a low-pressure chemical vapor deposition (LPCVD) process. Ion implantation may be performed into the etch stop layer 30 to dope the polysilicon. Dielectric spacers 32, 34 may be formed on the side on the sides of the gate stack 26 and may comprise, for example, $SiO_2$ or $Si_3N_4$.

Figure 2:
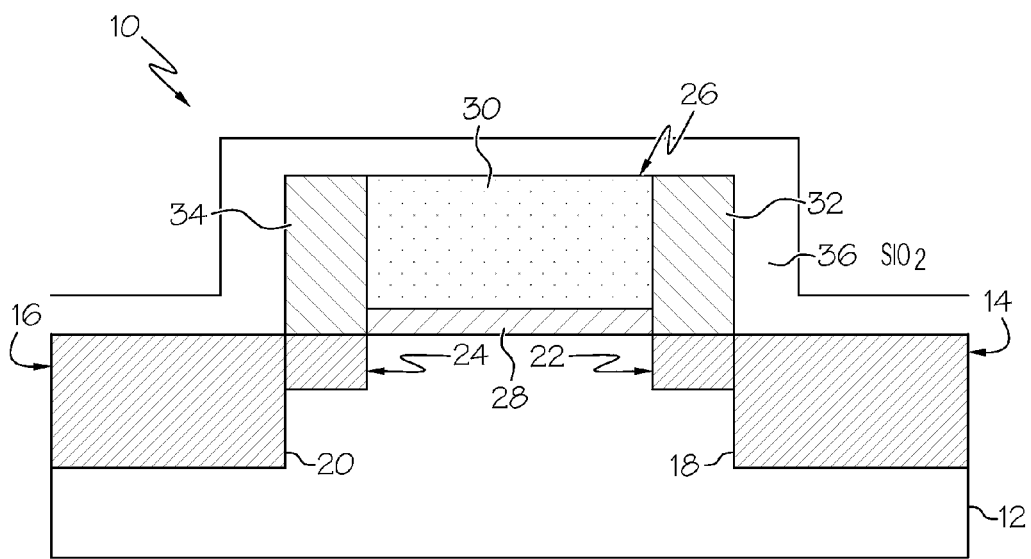
FIG. 2 shows a cross-sectional representation of the CMOS transistor shown in FIG. 1 after the application of an etch stop layer in accordance with one embodiment of the present invention.

FIG. 2 shows the transistor structure 10 after the addition of an etch stop layer 36 over the top surface of the transistor structure 10. In some embodiments the etch stop layer 36 may comprise $SiO_2$. The choice of the material for the etch stop layer 36 may depend to some extent on the material used for the phase switch layer. The etch stop layer 36 may be deposited using conventional techniques such as CVD. The purpose of the etch stop layer 36 is to facilitate the removal of the subsequent phase switch, or phase change layer, as described below. Alternatively, other layers that can by etched selectively with respect to the phase switch layer may instead be used.

Figure 3:
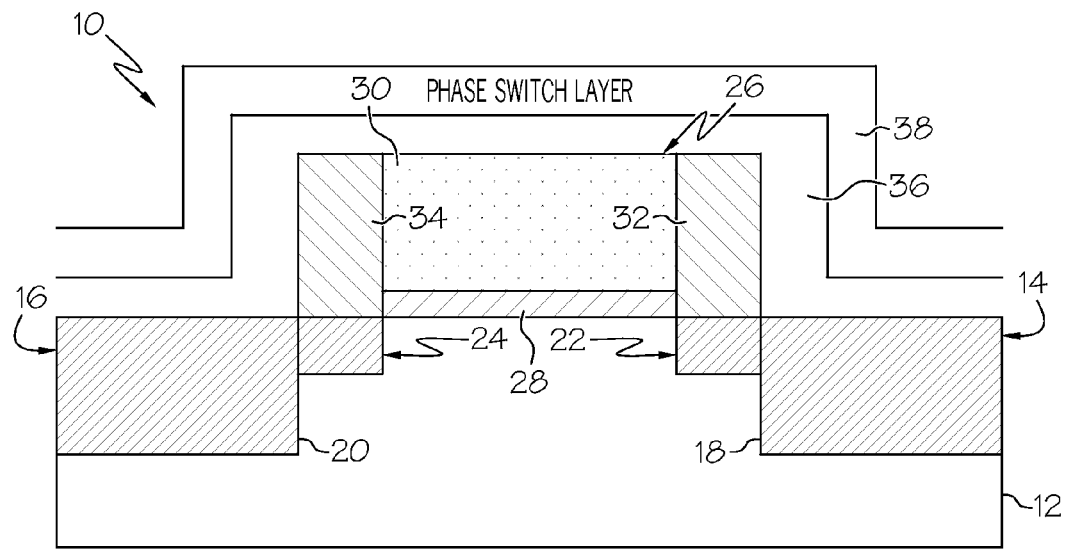
FIG. 3 shows a cross-sectional representation of the CMOS transistor shown in FIG. 2 after the application of a phase switch layer in accordance with one embodiment of the present invention.

FIG. 3 shows the transistor structure 10 after the deposition of a phase switch layer 38 over the top surface of the transistor structure 10. The phase switch layer 38 may comprise a temperature dependant phase switch material such as polycrystalline Si, which changes from substantially amorphous to substantially crystalline when changing phase in response to a rise in temperature. Another characteristic of the phase switch layer 38 is that its phase change may be accompanied by a substantial change in the index of refraction, and hence its reflectance, as described below.

Figure 4:
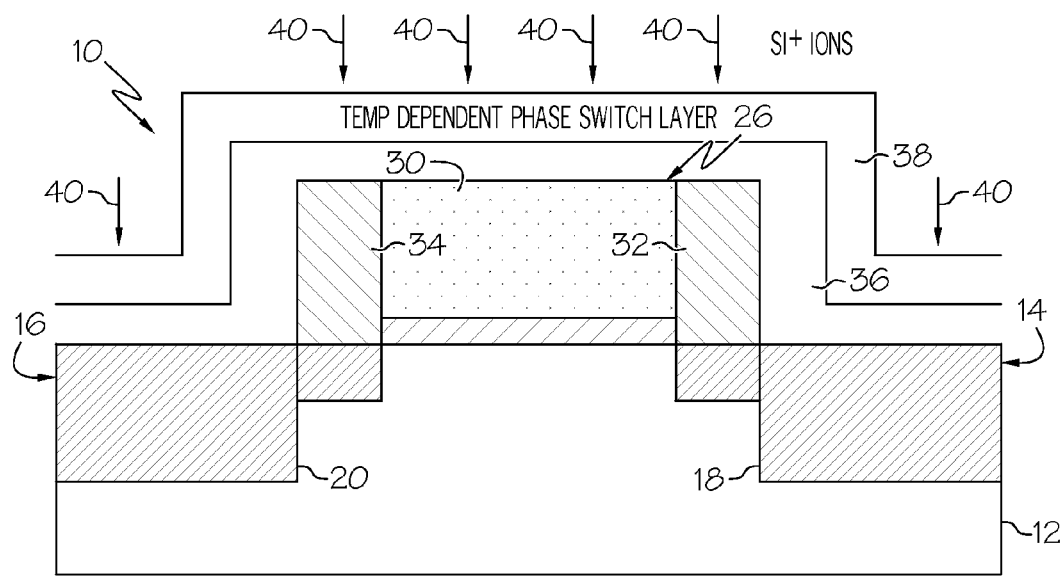
FIG. 4 shows a cross-sectional representation of the CMOS transistor shown in FIG. 3 during an ion implantation process to the phase shift layer, to vary the phase change temperature in accordance with one embodiment of the present invention.

FIG. 4 shows the transistor structure 10 during an ion implantation step. Ions 40 are implanted into the phase switch layer 38 in order to vary the degree of amorphization of the phase switch layer 38. By varying the amorphization, the temperature at which the phase switch layer changes phase from amorphous to crystalline may be determined. In particular, ions are implanted into the phase switch layer 38 until the phase switch temperature is approximately equal to that of the temperature that is desired for annealing of the semiconductor structure 10. Ion implantation may be performed using $Si^+$ or other ions capable of amorphizing the phase switch layer 38 in a controlled manner. Preferably, the implant conditions are selected such that the ions do not penetrate through the etch stop layer 36.

Figure 5:
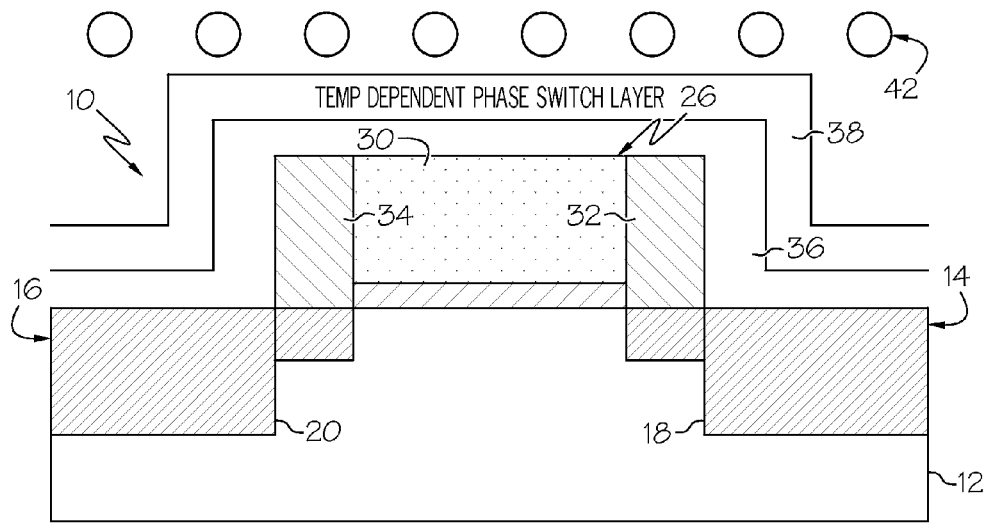
FIG. 5 shows a cross-sectional representation of the CMOS transistor shown in FIG. 4 during the annealing process in accordance with one embodiment of the present invention.

FIG. 5 shows the transistor structure 10 during an annealing step. An annealing unit 42 may generate electromagnetic radiation in the 400-800 nm range to heat the transistor structure 10. The annealing unit 42 may comprise a flash annealing apparatus using a Xenon lamp, or a laser. Annealing may be configured to heat the transistor structure 10 to a temperature just slightly above the desired annealing temperature (also the phase change temperature of the phase switch layer 38), which may be, for example, in the range of 1300 degree C. The annealing time may be very fast, for example in the nanosecond range.

Once the desired annealing temperature is reached, the phase switch layer 38 may change from substantially amorphous to substantially crystalline. The resultant change in the index of refraction may cause an increase in the amount of light reflected back toward the annealing unit 42 and a decrease in the amount of heat absorbed by the phase switch layer and transferred to the transistor structure 10 below. Consequently, the heating of the structure below the phase switch layer 38 may stop the annealing process since little additional energy will be received from the annealing unit 42. As a result, the annealing temperature may be substantially uniform throughout the transistor structure 10, as well as throughout the wafer. Even though areas of varying pattern density may reach the annealing temperature (and phase change temperature) at different times, the maximum annealing temperature may be the same throughout the wafer. As a result, the activation of the doped regions may be substantially uniform, yielding transistors with uniform performance characteristics throughout the wafer.

Figure 6:
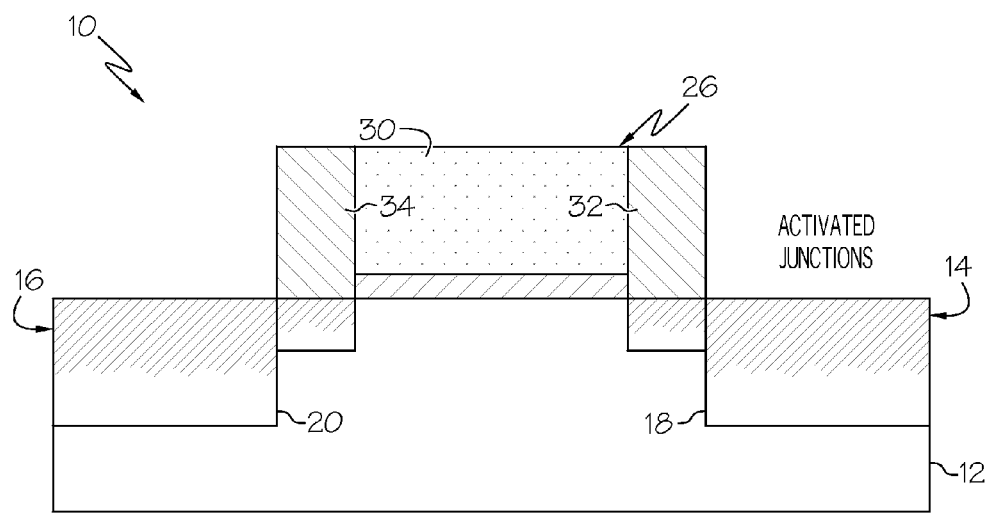
FIG. 6 shows a cross-sectional representation of the CMOS transistor shown in FIG. 5 after the removal of the phase switch and the etch stop layers in accordance with one embodiment of the present invention.

FIG. 6 shows the transistor structure 10 after the removal of the phase switch layer 38 and the etch stop layer 36. This may be accomplished by using the selectivity difference between the phase switch layer 38 and the etch stop layer 36, which allows a dry etch to be carried out to remove the phase switch layer 38. The remaining etch stop layer may then be removed by buffered hydrofluoric acid (HF) wet etch. Subsequently, a standard CMOS process flow may be carried out to turn the semiconductor structure 10 into a working device.

Figure 7:
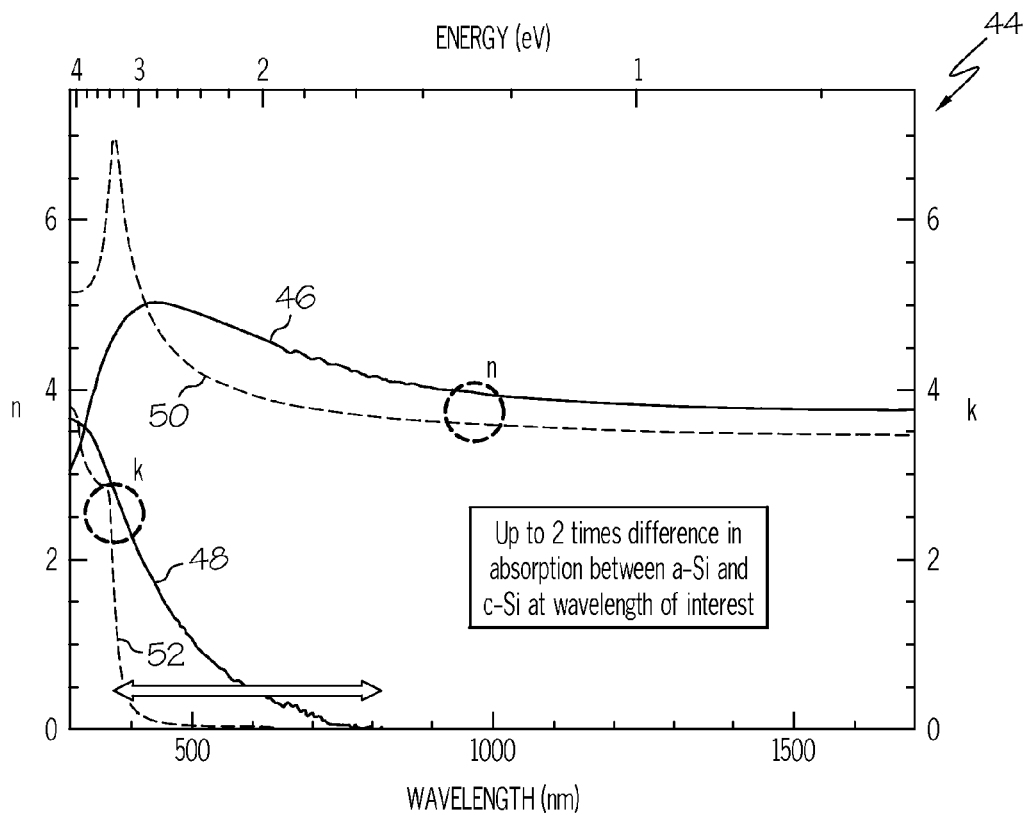
FIG. 7 shows a graph of the index of refraction of amorphous and crystalline silicon as a function of wavelength in accordance with the present invention.

FIG. 7 shows a graph 44 of the index of refraction of amorphous and crystalline silicon, such as may be used for the phase switch layer 38, as a function of wavelength. The index of refraction=n+ik, where N measures how fast light is slowed down, and k is the extinction coefficient that measures how well amorphous silicon or crystalline silicon absorbs electromagnetic waves. Solid curves 46 and 48 show the real (n) and imaginary (k) part of the index of refraction for relaxed amorphous silicon as a function of wave length obtained from spectroscopic ellipsometry measurements. The dashed lines 50, 52 show the real and imaginary part of the index values for crystalline silicon as published in the literature. Note that in the wavelength of interest between 400-800 nm there could be up to two times difference in absorption between amorphous and crystalline silicon, while a typical value may be a factor of about 1.75. It is because of this characteristic of the phase switch layer 38, that causes most of the electromagnetic energy during annealing to be reflected when the phase switch occurs.

Figure 8:
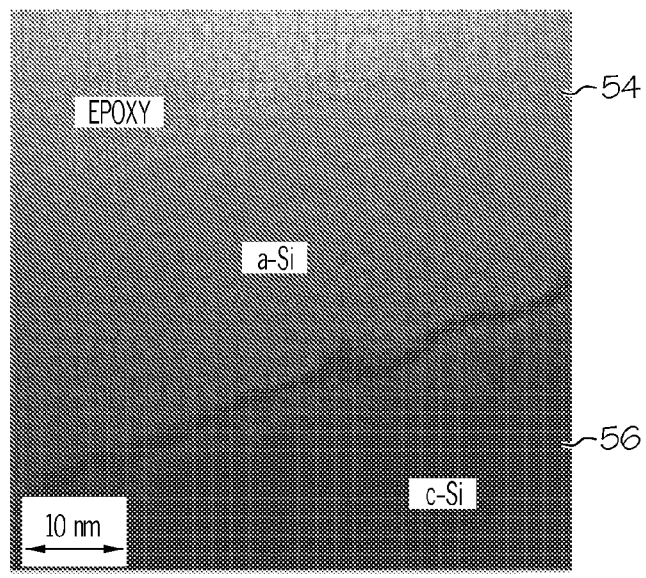
FIG. 8 shows a micrograph of the phase shift layer shown in FIG. 3 before the annealing process.
Figure 9:
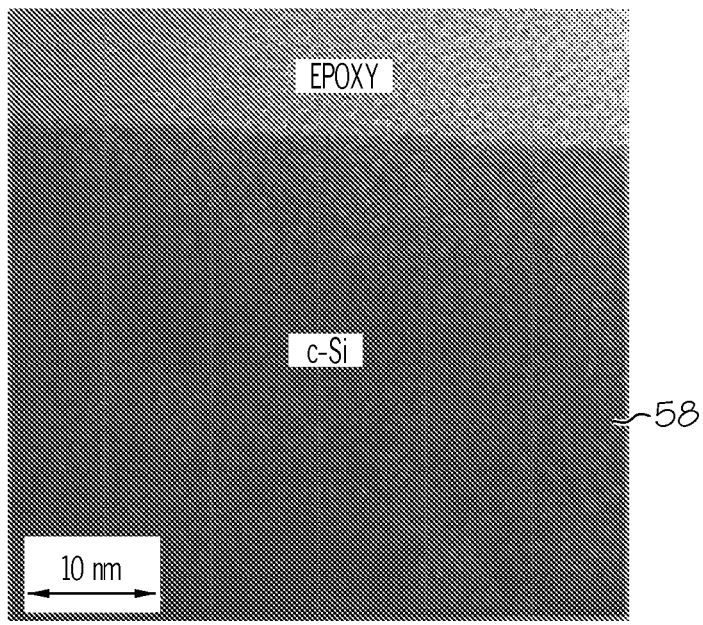
FIG. 9 shows a micrograph of the phase shift layer shown in FIG. 8 after the annealing process.

FIG. 8 shows a micrograph of the phase shift layer 38 before the annealing process. It can be seen that the upper region 54 is composed of amorphous silicon (a-Si), while the lower region 56 is composed of crystalline silicon (c-Si). FIG. 9 shows a micrograph of the phase shift layer shown in FIG. 8 after the annealing process. Once the phase switch temperature is reached during the annealing process, the amorphous region 46 may change to crystalline silicon region 58 as shown in FIG. 9.

Figure 10:
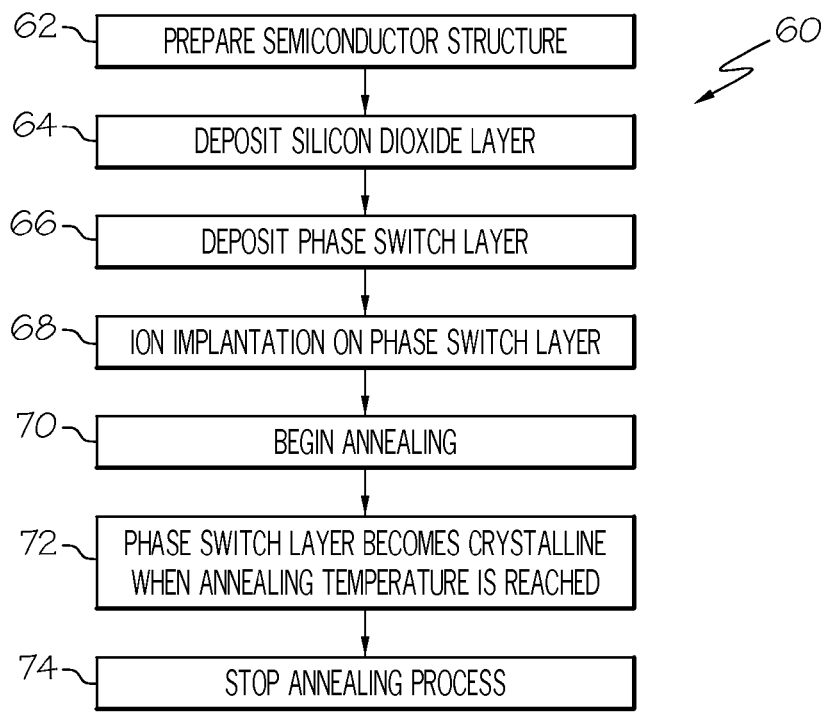
FIG. 10 shows a flow chart of an annealing process in accordance with one embodiment of the invention.

FIG. 10 shows a flow chart of a process 60 for annealing a semiconductor structure 10 in accordance with one embodiment of the invention. In step 62 the semiconductor structure may be prepared so that it appears as shown in FIG. 1. In step 64 the etch stop layer 36 may be deposited. In step 66 the phase switch layer 38 may be deposited. In step 68 ion implantation may be conducted on the phase switch layer 36 to determine the phase switch temperature. In step 70 the annealing process may begin. In step 72 when the phase switch temperature is reached the phase switch layer 36 may change from an amorphous state to a crystalline state. In step 74 the annealing process may be stopped with the result being that the semiconductor structure 10 has its doped regions activated at a uniform temperature across the wafer. Subsequent processes may then be performed in a conventional manner to complete the semiconductor device.

Thus, it may be seen that the present invention may provide a temperature-dependant phase switch layer for improved temperature uniformity during annealing. As a result, the annealing process will activate the doped regions in a uniform manner and there will minimum differences in the performance characteristics of devices at different parts of the wafer.

It should be understood, of course, that the foregoing relates to exemplary embodiments of the invention and that modifications may be made without departing from the spirit and scope of the invention as set forth in the following claims.

We claim:

1. A method of fabricating a semiconductor device comprising:

forming a phase switch layer over a semiconductor structure, the phase switch layer is formed of a first material, the phase switch layer having an initial first phase;

processing the phase switch layer to transform the phase switch layer into a second amorphous phase from the initial first phase, wherein the processing comprises selecting a phase switching temperature, corresponding to a degree of amorphization, at which the phase switch layer switches from the second amorphous phase to a third crystalline phase; and annealing the semiconductor structure with electromagnetic radiation to heat the semiconductor structure, wherein annealing causes the phase switch layer to switch from the second amorphous phase to the third crystalline phase when the phase switch layer reaches the phase switching temperature, the third crystalline phase substantially blocking additional electromagnetic radiation from reaching the semiconductor structure.

2. The method of claim 1 further comprising: removing said phase switch layer.

3. The method of claim 2 wherein the selected phase switching temperature is equal to at least a desired annealing temperature of the substrate.

4. The method of claim 1 wherein said substantially blocking comprises substantially increasing the amount of said electromagnetic radiation that is reflected by said phase switch layer.

5. The method of claim 4 wherein said annealing comprises increasing the portion of said phase switch layer that is crystalline as compared to the portion that is amorphous.

6. The method of claim 1 wherein the annealing comprises providing an annealing temperature that is slightly above the selected phase switching temperature.

7. The method of claim 1 wherein said annealing is a flash annealing process.

8. The method of claim 7 wherein said electromagnetic radiation is generated by a Xenon lamp.

9. The method of claim 7 wherein said electromagnetic radiation is generated by a laser.

10. The method of claim 1 wherein said annealing process takes place in less than one millisecond.

11. The method of claim 1, wherein the phase switch layer undergoes a change in index of refraction at the selected phase switch temperature.

12. The method of claim 1, wherein the semiconductor structure comprises a transistor structure.

13. The method of claim 1 comprises forming an etch stop layer over the semiconductor structure below the switch layer.

14. A method of uniformly activating doping regions of a semiconductor wafer comprising:

doping selected regions of the semiconductor wafer;

depositing a phase switch layer over the semiconductor wafer, the phase switch layer having an initial first phase;

processing the phase switch layer which is over the semiconductor wafer to transform the phase switch layer into a second amorphous phase from the initial first phase, wherein the processing comprises selecting a phase switching temperature, corresponding to a degree of amorphization, at which the phase switch layer switches from the second amorphous phase to a third crystalline phase, and implanting ions into the phase switch layer;

annealing the semiconductor wafer with electromagnetic radiation to heat the semiconductor wafer, wherein annealing causes the phase switch layer to switch from the second amorphous phase to the third crystalline phase when the phase switch layer reaches the phase switching temperature, the third crystalline phase substantially blocking additional electromagnetic radiation from reaching the semiconductor wafer; and removing the phase switch layer.

15. The method of claim 14 wherein said ions are $Si^+$ ions.

16. The method of claim 14 further comprising applying an etch stop layer on said semiconductor wafer before depositing said phase switch layer.

17. The method of claim 14 further comprising increasing the proportion of reflected electromagnetic radiation from the phase switch layer when the selected phase switching temperature is reached.

18. The method of claim 14, wherein depositing a phase switch layer comprises depositing a polysilicon layer.

19. The method of claim 18, wherein implanting ions into said phase switch layer forms an amorphous silicon region within the phase switch layer.

20. The method of claim 19, wherein the amorphous silicon region changes to a crystalline region at the selected phase switch temperature.

21. A method of fabricating a device comprising:

providing a substrate prepared with a feature;

forming a phase switch layer over the feature, the phase switch layer having an initial first phase;

processing the phase switch layer to transform the phase switch layer into a second amorphous phase from the initial first phase, wherein the processing comprises selecting a phase switching temperature, corresponding to a degree of amorphization, at which the phase switch layer switches from the second amorphous phase to a third crystalline phase; and annealing the substrate with electromagnetic radiation, wherein annealing causes the phase switch layer to switch from the second amorphous phase to the third crystalline phase when the phase switch layer reaches the phase switching temperature, the third crystalline phase substantially blocking additional electromagnetic radiation from reaching the feature.

* * * * *